(12) United States Patent
Allen

(10) Patent No.: US 6,426,854 B1
(45) Date of Patent: *Jul. 30, 2002

(54) VOLTAGE CLAMP

(75) Inventor: Michael J. Allen, Rescue, CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/096,730

(22) Filed: Jun. 10, 1998

(51) Int. Cl.⁷ .................................................. H02H 9/00
(52) U.S. Cl. .......................................... 361/56; 327/321
(58) Field of Search ......................... 361/56, 111, 119, 361/90, 91, 92; 326/23, 24, 26, 27, 80, 81, 83, 86, 30, 31; 327/100, 38, 381, 321

(56) References Cited

U.S. PATENT DOCUMENTS

| | | | | |
|---|---|---|---|---|
| 4,922,371 A | * | 5/1990 | Gray et al. | 361/91.1 |
| 5,546,016 A | | 8/1996 | Allen | 326/30 |
| 5,654,862 A | * | 8/1997 | Worley et al. | 361/111 |
| 6,054,875 A | | 4/2000 | Wayner | 326/83 |

\* cited by examiner

Primary Examiner—Ronald W. Leja
(74) Attorney, Agent, or Firm—Howard A. Skaist

(57) ABSTRACT

Briefly, in accordance with one embodiment of the invention, an integrated circuit includes a bias voltage source. The bias voltage source is coupled to a pad of the integrated circuit so as to clamp the pad voltage to the bias voltage when, during circuit operation, the voltage of the pad exceeds an upper voltage rail of the integrated circuit.

7 Claims, 2 Drawing Sheets

VOLTAGE CLAMP

BACKGROUND

1. Field

The invention is related to voltage clamps and, more particularly, to voltage clamps for input/output port or pad protection.

2. Background Information

As is well-known, operating voltages for integrated circuit components and integrated circuit chips continue to decline. One disadvantage of this decline in operating voltages is that legacy devices and/or systems that operate at these legacy voltage levels maintain voltage signal levels at high voltages compared to the voltage signal levels for native process technology, which continues to decline approximately 30% per generation. Therefore, it is desirable to devise circuit techniques or other approaches to allow backwards compatibility for one generation, or even more, of fabrication process technology. For example, state-of-the-art fabrication process technology is on the order of approximately 1.8 volts, although legacy operating voltages may be at about 3.3 volts. Therefore, voltage excursions from this operating voltage, such as may occur at a pad of an integrated circuit, for example, or at a pin or port, may damage transistors fabricated using native process technology, but being applied in circuit environments employing legacy operating voltages. A need exists for techniques to handle these legacy operating voltages using native process technology and/or reduce the damage that may occur from voltage excursions.

SUMMARY

Briefly, in accordance with one embodiment of the invention, an integrated circuit comprises: a bias voltage source. The bias voltage source is coupled to a pad of the integrated circuit so as to clamp the pad voltage to the bias voltage when, during circuit operation, the voltage of the pad exceeds an upper voltage rail of the integrated circuit.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

As previously indicated, operating voltages for integrated circuits and other electronic circuitry continue to decline. Therefore, integrated circuits manufactured using native process technology, for example, are typically not intended to be operated at the voltage signal levels employed in legacy systems or circuits. Therefore, circuit techniques or other approaches to allow "backwards compatibility" for such native process technology intended to be operated at lower voltages is desirable.

Figure 1:
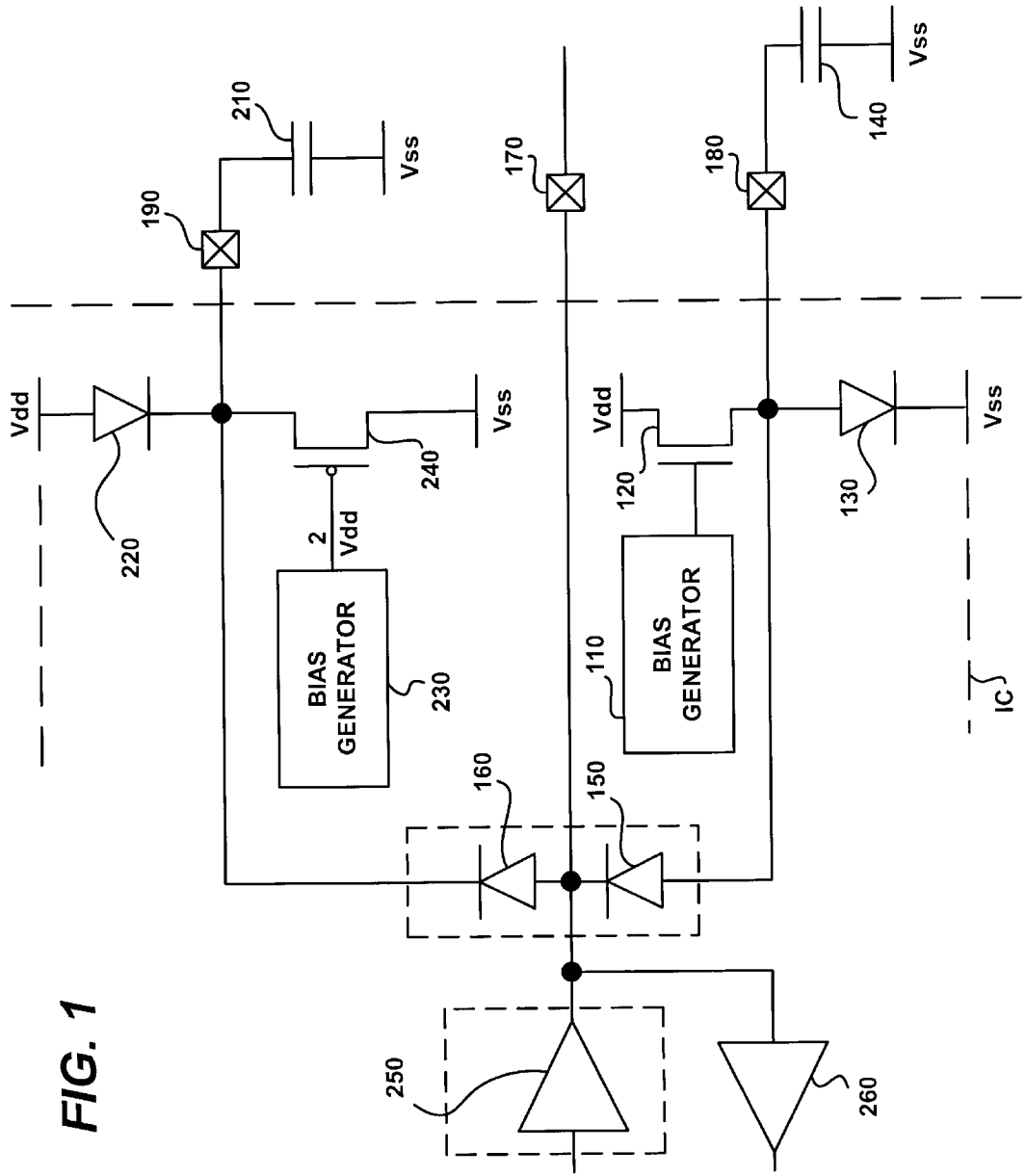
FIG. 1 is a circuit diagram illustrating an embodiment of a voltage clamp in accordance with the present invention.

FIG. 1 is a circuit diagram illustrating an embodiment 100 of a voltage clamp in accordance with the invention. This embodiment is illustrated on an integrated circuit (IC) chip, although the invention is not limited in scope in this respect. For example, pad 170 may alternatively comprise a terminal, pin or port, for example. A voltage clamp may be desirable for transistors fabricated using native process technology and operated at legacy voltage levels, because voltage excursions, at, for example, the pad of an integrated circuit, may damage such transistors. Therefore, it is desirable to reduce the voltage swing of the signal to be applied to the pad in order to maintain reliability and reduce risk of damage.

Figure 2:
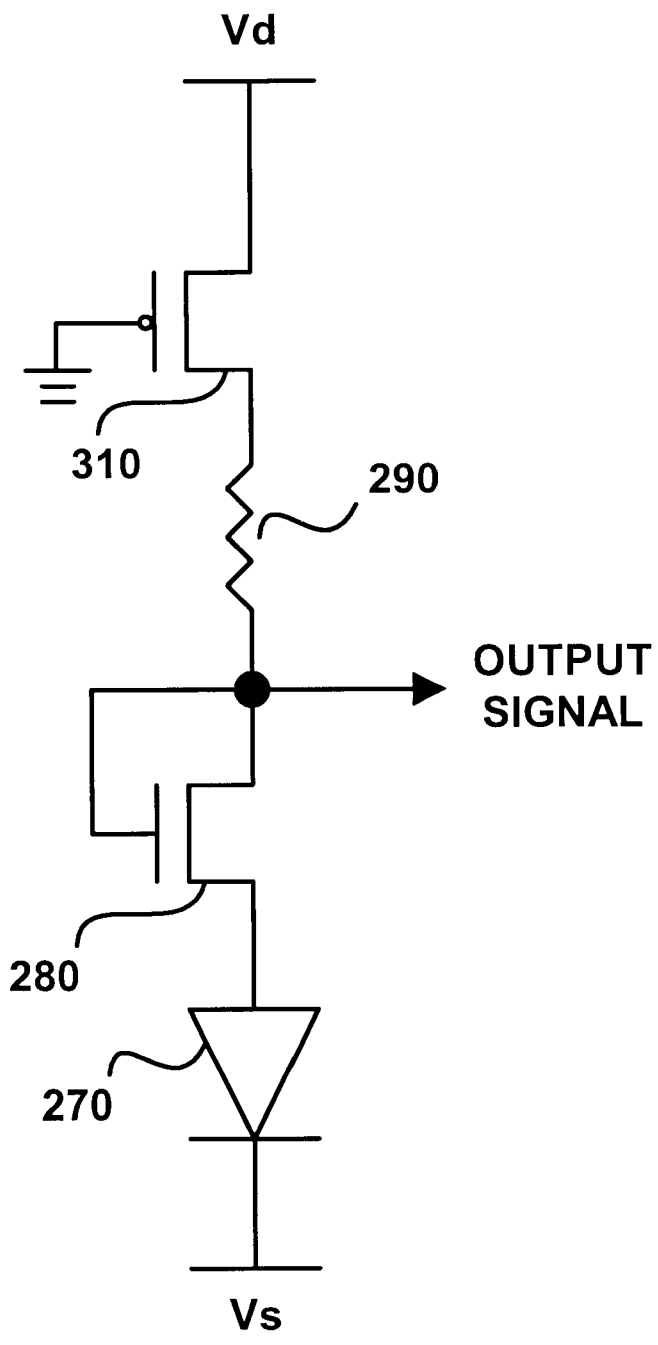
FIG. 2 is a circuit diagram of an embodiment of a bias generator that may be employed in the embodiment illustrated in FIG.1.

For embodiment 100, as illustrated, two transistors, such as metal-oxide semiconductor (MOS) transistors or devices, 120 and 240 in FIG.1, are employed with external capacitors, such as 140 and 210, to provide, in this particular embodiment, two voltage clamp supplies. As illustrated in FIG. 1, in this embodiment bias generators 110 and 230 are coupled so as to apply a bias voltage to the gates of transistors 240 and 120, respectively. The bias generators provide a voltage to the gates of devices 120 and 240 to "turn on" these transistors, and keep them "turned on" when output pads 180 and 190 drop below a target voltage level. For device or transistor 120, the bias generator may be targeted to supply about one N-channel threshold voltage plus one diode turn-on voltage above the $V_{ss}$ supply voltage level, in one implementation, n for example. This would be in the range of 1.2V for a particular process, but again this may vary with the process used, and the specific implementation. Therefore, the invention is not limited in scope to these particular aspects of this embodiment. Likewise, bias generator 230 could be set to supply $V_{dd}$ minus one P-channel threshold minus one diode turn-on voltage, which could, for example, be in the range of Vdd minus 1.2V for a particular implementation. Circuit configurations for producing a bias voltage source are well-known in the art and will not be described in great detail here. Any one of a variety of bias voltage sources or bias generator circuits may be employed. FIG. 2, without limitation, illustrates one such embodiment. The output voltage in this embodiment is the sum of the voltage across the diode and the voltage across the N-channel metal-oxide semiconductor (NMOS) transistor. In addition, as another example, a bandgap circuit might be employed, although the voltage produced may or may not be useful, depending on the particular embodiment of the invention. Due to the coupling of diodes 130 and 220 to the two transistors, 240 and 120, respectively, the voltage clamp supplies-respectively provide a voltage level one threshold voltage above the source voltage for this particular integrated circuit, where $V_{ss}$ designates the source voltage or lower power rail, and a voltage level one threshold voltage below the drain voltage for this particular integrated circuit, where $V_{dd}$ designates the drain voltage or upper rail voltage. More specifically, the voltage across diodes 130 and 220 are respectively added to $V_{ss}$ and subtracted from $V_{dd}$ to provide the bias voltage for the voltage clamp circuits due to the configuration of this particular embodiment.

As illustrated for the embodiment of FIG. 1, "fast" P-N diodes, 150 and 160 in FIG. 1, are coupled to these respective voltage clamp supplies and to pad 170. In general, it is desirable if the speed of the "turn-on" and "turn-off" of the "fast" diode occurs at a speed that shortens the duration of the overstress produced by the over or undershoot. For example, without limitation, a "turn-on" speed of less than one-half of a nanosecond might be useful in some situations, for example. Therefore, when the voltage applied to pad 170 exceeds the rails, that is, either above $V_{dd}$ or below $V_{ss}$, diodes 150 and 160 operate to "clamp" the voltage of the pad to the bias voltage supplied, $V_{dd}$ or $V_{ss}$, depending upon which diode, 150 or 160, is activated. Therefore, in this embodiment, the bias voltages, $V_{dd}$ or $V_{ss}$ are coupled to the pad of the integrated circuit so as to clamp the pad voltage to these voltages when, during circuit operation, the voltage of the pad either exceeds the upper voltage rail of the integrated circuit or falls below the lower voltage rail of the integrated circuit.

While typically Electrostatic Discharge (ESD) protection diode clamps begin to conduct when the voltage applied to the pad reaches $V_{dd}$ plus 0.7 volts and $V_{ss}$ minus 0.7 volts, where 0.7 volts is the typical voltage across a forward-biased diode, in this particular embodiment diodes >150 and 160 conduct at $V_{dd}$ and $V_{ss}$, respectively. Furthermore, it is also possible to adjust the clamp voltages so that the diodes turn on even earlier, if desired. For example, in this embodiment, if the bias voltage were adjusted to raise the voltage at pad 180 by 200 mV, for example, fast P-N diode 150 would begin to conduct when node 170 dropped below 200 mV relative to $V_{ss}$. In this particular embodiment, a capacitor value for the external capacitor of approximately 10 nanofarads would be adequate, although the invention is not limited in scope in this respect. In this embodiment, diodes 150 and 160 provide typically faster "turn on" characteristics than clamps employing metal-oxide semiconductor transistors and are, likewise, more efficient in terms of employing less silicon "real estate" of the integrated circuit, in such an embodiment. Although, of course, the invention is not limited in scope in this respect.

An advantage of this approach is that a fast diode may relatively quickly clamp the voltage swing of the pad before the voltage excursion is too large. Furthermore, the metal-oxide semiconductor transistors, in this embodiment, for example, may be employed to replace the charge of the clamp capacitors, such as capacitors 140 and 210, at a slower rate. These transistors now have a data cycle to replenish the charge of the capacitors, and, therefore, a smaller current and smaller devices may be employed. Therefore, the particular embodiment, for example, is smaller and faster than alternative approaches, while providing better control of such signal excursions. Furthermore, it allows legacy signaling, such as 3.3 volt signaling, to be employed with transistors manufactured using, here, for example, a nominal 1.8 volt fabrication process. Therefore, fast, leading edge products may be manufactured that continue to interface with, in this particular example, 3.3 volt buses, such as for the Accelerated Graphics Port (APG) Interface Specification, version 1, dated Aug. 1, 1996, or version 2.0, dated May 4, 1998, available from, for example, the AGP Implementors Forum or Intel Corp., or for Synchronous Dynamic Random Access Memory (SDRAM), using this native process technology. Of course, the invention is not limited in scope to these voltage levels or to these particular interfaces.

FIG. 1 illustrates one embodiment in accordance with the invention and alternative embodiments are possible. For example, other embodiments may not be incorporated on an IC or on a single IC. Likewise, many schemes to produce bias voltages to be applied to the transistors may be employed. Furthermore, fast diodes may not be employed in some embodiments, and the transistors and diodes illustrated may be replaced with alternative semiconductor devices providing similar characteristics to produce the desired result.

An embodiment of a method of limiting the voltage excursion from a predetermined voltage level of a node of a circuit in accordance with the invention is as follows. Another node of the circuit may be biased to approximately one semiconductor device threshold away from a voltage rail for the circuit, such as illustrated for the embodiment shown in FIG. 1, for example. The another node may be coupled to the node being voltage excursion limited via a semiconductor device capable of having the one semiconductor device threshold voltage across it during circuit operation. For example, without loss of generality, in FIG. 1, pad 170 is coupled to pad 190 via diode 160. Thus, in this embodiment, the semiconductor device comprises a fast P-N diode. Likewise, the voltage rail comprises the upper rail and the threshold voltage comprises a diode turn-on voltage below the upper voltage rail. Likewise, as illustrated by pad 180 in this embodiment, the voltage rail may also comprise the lower voltage rail and the threshold voltage may comprise a diode turn-on voltage above the lower rail. Furthermore, in this embodiment, biasing includes applying a charged capacitor, such as capacitors 140 and 210, to the node. For example, the capacitor may be charged to one of the upper voltage rail or the lower voltage rail of the circuit. Of course, the invention is not limited in scope to this particular embodiment.

While certain features of the invention have been illustrated as described herein, many modifications, substitutions, changes and equivalents will now occur to those skilled in the art. It is, therefore, to be understood that the appended claims are intended to cover all such modifications and changes as fall within the true spirit of the invention.

What is claimed is:

1. An integrated circuit comprising: a first pad of an integrated circuit being coupled so as to clamp the voltage of a second pad to approximately a lower voltage rail when, during circuit operation, the voltage applied to the second pad exceeds the lower voltage rail of the integrated circuit.

2. The integrated circuit of claim 1, and further comprising:
   a third pad of the integrated circuit being coupled so as to clamp the voltage of the second pad to approximately an upper voltage rail when during circuit operation, the voltage applied to the second pad exceeds the upper voltage rail of the integrated circuit.

3. The integrated circuit of claim 2, wherein the voltage of the second pad is more than the voltage across a biased semiconductor device.

4. The integrated circuit of claim 2, wherein the third pad is coupled to a capacitor coupled to receive charge.

5. The integrated circuit of claim 1, wherein the voltage of the second pad is more than the voltage across a biased semiconductor device.

6. The integrated circuit of claim 1, wherein the first pad is coupled to a capacitor coupled to receive charge.

7. A voltage clamp for a circuit comprising:
   a means for providing a bias voltage;
   the bias voltage means being coupled to a first node so as to clamp a node voltage of a second node to either one of an upper voltage rail and a lower voltage rail of the circuit when, during circuit operation, the voltage applied to the second node is equal to one of an upper voltage rail and a lower voltage rail, respectively, of the circuit.

* * * * *